United States Patent [19]
Baker et al.
[11] 3,922,184
[45] Nov. 25, 1975

[54] METHOD FOR FORMING OPENINGS THROUGH INSULATIVE LAYERS IN THE FABRICATION OF INTEGRATED CIRCUITS

[75] Inventors: Theodore H. Baker, Wappingers Falls; Majid Ghafghaichi, Poughkeepsie, both of N.Y.

[73] Assignee: IBM Corporation, Armonk, N.Y.

[22] Filed: Dec. 26, 1973

[21] Appl. No.: 427,887

[52] U.S. Cl. ...................... 156/11; 156/17; 96/36.2
[51] Int. Cl.[2] ........................................ H01L 21/308
[58] Field of Search ......... 156/11, 17; 96/36.1, 36.2

[56] References Cited

UNITED STATES PATENTS

| | | | |
|---|---|---|---|
| 3,649,393 | 3/1972 | Hatzakis | 156/8 |
| 3,673,018 | 6/1972 | Dingwall | 96/36.2 |
| 3,713,922 | 1/1973 | Lepselter et al. | 96/36.2 |
| 3,753,803 | 8/1973 | Nomura et al. | 156/17 |
| 3,823,015 | 7/1974 | Fassett | 156/17 |

*Primary Examiner*—Douglas J. Drummond
*Assistant Examiner*—Jerome W. Massie
*Attorney, Agent, or Firm*—J. B. Kraft

[57] ABSTRACT

In the fabrication of integrated circuits, a method of forming openings through an insulative layer wherein a plurality of openings being formed through said insulative layer are subjected to two separate etching steps in order to insure that the opening is made.

In the method, a layer of electrically insulative material is formed on a substrate. The layer is covered with a first photoresist mask having a plurality of openings. Then, a plurality of openings through the insulative layer coincident with the mask openings is made by applying a chemical etchant through the photoresist mask. The second photoresist mask having a plurality of openings coincident with the openings in the insulative layer is then formed on said layer; these openings in the second photoresist mask have smaller lateral dimensions than the openings in the insulative layer. Thus, the sides of the openings in the insulative layer are masked by photoresist. The chemical etchant is reapplied through the second photoresist mask. In this reapplication, any openings which may not have been fully etched through the insulative layer in the first etching step are now made. On the other hand, because the sides of completed openings are already masked by photoresist, there is no possibility of the reapplied etchant etching through the sides of such completed holes to overetch such holes.

5 Claims, 7 Drawing Figures

METHOD FOR FORMING OPENINGS THROUGH INSULATIVE LAYERS IN THE FABRICATION OF INTEGRATED CIRCUITS

BACKGROUND OF INVENTION

This invention relates to the fabrication of integrated circuit structures, and particularly to the fabrication of planar integrated circuit structures wherein the semiconductor substrate is covered by a layer or layers of insulative material such as silicon dioxide or silicon nitride. This insulative layer or layers act to electrically insulate or passivate the substrate. In the fabrication of such integrated circuit structures, since the insulative layer also serves as a mask for many of the processing steps, such as diffusion, ion implantation or in the formation of metallization, it is not unusual to have an insulative layer of differing thickness at any given stage in the fabrication process. The art has recognized that there is a problem in forming openings through such insulative layer of different thicknesses. When such openings are formed by conventional photoresist mask chemical etching, it has been found to be impractical to try to etch openings through thicker and thinner portions of an insulative layer in a single photoresist masked etching step. If the etching is continued for a sufficient period of time to etch holes through the thicker portions of the insulative layer, the openings in the thinner portions tend to become over-etched, i.e., since chemical etching proceeds laterally as well as vertically, undesirable lateral etching in holes through the thinner portion tend to expand lateral dimensions of such holes well beyond intended dimensions. Such over-etching in openings through thinner portions of the insulative layer is particularly troublesome in very densely packed large scale integrated circuits where the spacing between lateral junctions is so small that an over-etched opening may short out an adjacent junction. In any event, such over-etching introduces an uncontrollable element in the formation of subsequent electrical metallic contacts in the etched openings.

Because of this over-etching problem, the art has gone to multiple etching steps in forming openings through insulative layers which have such thicker and thinner portions. For example, in a first photoresist mask etching step, the openings may be formed through the thicker portions of the insulative layer with the thinner portions being completely blocked out by photoresist masks, after which the thicker portions including their openings are blocked out by a subsequent photoresist mask, and the openings through the thinner portions are formed in a separate etching step.

Recognizing that such dual etching steps are required in etching openings through an insulative layer having thicker and thinner portions, the present invention provides an approach which utilizes this dual etching step to achieve the solution of another problem which has been troublesome in the integrated circuit fabrication art. Because of the previously described movement in the integrated circuit art towards large scale integration, greater device densities, and circuits having in the order of thousands of devices on a single chip, the sizes of contact openings and other interconnector openings through insulative layers have become quite minute while the number of such openings has drastically increased. Because of these factors, the chances have increased for an opening through an insulative layer to remain unetched or partially etched. In view of the expense of such large scale integrated circuits, it would be desirable to insure against such etching failures. The present invention provides a method of double etching which is free of the over-etch problem in etching insulative material having thicker and thinner portions and, in addition, insures against failures which prevent the complete etch-through of openings.

SUMMARY OF THE PRESENT INVENTION

Accordingly, it is an object of the present invention to provide a method of forming openings through insulative layers in which failures to completely etch through particular openings is minimized.

It is another object of the present invention to provide a method in the fabrication of integrated circuits for forming openings through insulative layers having thicker and thinner portions which both avoids the problem of over-etching in openings through the thinner portions, and insures against failure to etch through particular holes.

It is a further object of the present invention to provide a method involving dual etching steps in carrying out the aforementioned objects.

In accordance with the broadest aspect of the present invention, a method is provided for applying two discrete etching steps to a plurality of openings being formed through an insulative layer in such a manner that failure to etch through in either one of the steps is avoided, and problems of over-etching are minimized.

The method comprises forming a layer of insulative material on the substrate, and then covering the layer with a first photoresist mask having a plurality of openings. Then, by means of a chemical etchant, forming through said photoresist mask a plurality of openings through said insulative layer coincident with the mask openings. Next, a second photoresist mask which is different from the first mask is formed on the insulative layer; the second mask has a plurality of openings which are coincident in the openings in the insulative layer. The openings in the second photoresist mask have smaller lateral dimensions than the openings in the insulative layer. As a result, the sides of the opening in the insulative layer are masked with photoresist. Then, the previously described chemical etching step is repeated. During the second etching step, the openings which had been previously completely formed in the first etching step will now have their sides covered with photoresist which will protect any lateral over-etching during the second step. On the other hand, any insulative material still remaining in an unetched or partially etched opening will be etched through. Preferably, since the openings in the second photoresist mask have smaller lateral dimensions than the openings in the insulative layer which were properly formed through the first mask, the second etching step is carried out for a period sufficient to over-etch the previously unetched or partially etched openings for a period sufficient to give these openings substantially the same lateral dimensions as the originally etched openings.

The method of the present invention is particularly advantageous in methods involving the formation of openings through layers having thicker and thinner portions. In such methods, the first etching step may involve the formation of openings through only the thinner portions of the insulative layer, with the thicker portions being completely blocked out by the photoresist mask or, alternatively, the thicker portions being partially etched through. This is followed by the second etching step as previously described wherein the openings to be formed through the thinner portions are again subjected to etchants through a mask having coincident photoresist openings of smaller lateral dimensions; the second mask also has the openings to be formed through the thicker portions. The second etching step is carried out for a period of time sufficient to both complete the previously described etching through the thinner portions as well as etching through the thicker portions.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1A:
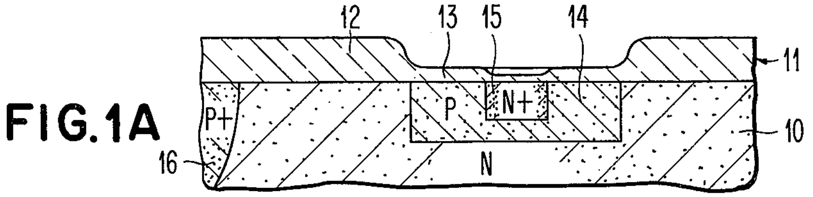
FIGS. 1A–1E are diagrammatic sectional views of a portion of an integrated circuit in order to illustrate the method of fabricating the preferred embodiments of the present invention.

With reference to FIG. 1A, there is shown a structure wherein semiconductor substrate 10 has formed thereon an insulative layer of silicon dioxide 11 having thicker portions 12 and thinner portions 13. Without describing the standard techniques for forming the various regions in the substrate, substrate 10 comprises an N type substrate having a resistivity in the order of 0.1 to 0.2 ohms/cm. in which a P type base region 14 having a $C_0$ of $1 \times 10^{19}$ atoms/cm$^3$ is formed. An N+ emitter region 15 having a $C_0$ of $2 \times 10^{21}$ atoms/cm$^3$ is formed within the base region. In the structure of the illustrative example, junction isolation is achieved by P+ region 16, not fully shown, which extends down to a P type substrate, not shown.

It should be understood that the structure in the FIGURE is merely representational and is simplified in order to illustrate the principles of the method of the invention. Without going into the mechanics of the various masking steps previously involved in the formation of the structure shown in FIG. 1A, it will be recognized that because of the necessity to remove and regrow various portions of the silicon dioxide layer 11 during the various fabrication steps, there will be thinner portions of this layer 13 over the base and the emitter regions and thicker portions of the layer 12 over other parts of the substrate. For illustrative purposes, the thickness of portions 12 are in the order of 7,000A while the thickness of thinner portions 13 will be in the order of 3,000A over the base regions and slightly thinner over the emitter regions.

Figure 1B:
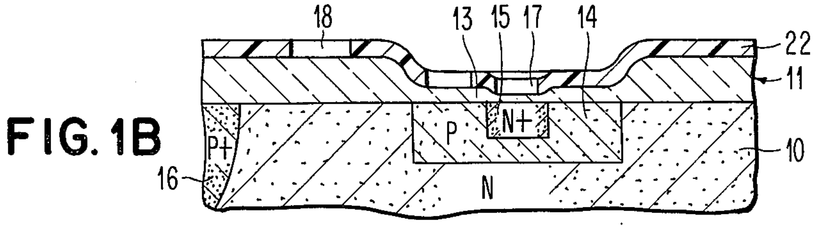

Next, as shown in FIG. 1B, a photoresist mask 22 is formed over the structure. The mask may be formed by standard photoresist techniques well known in the art. The composition of the photoresist mask may be a negative type photoresist mask such as KTFR which is distributed by Kodak Corporation and is a cyclized rubber composition containing a photoresist-sensitive cross-linking agent. Instead of KTFR, any other conventional photoresist may be used, such as the positive photoresist AZ111 distributed by Shipley Corporation and comprising a novolak-type phenol-formaldehyde resin and a photosensitive cross-linking agent. The photoresist mask 22 has apertures 17 over thinner portions 13 of $SiO_2$ layer and openings 18 over the thicker portions of the silicon dioxide.

Figure 1C:
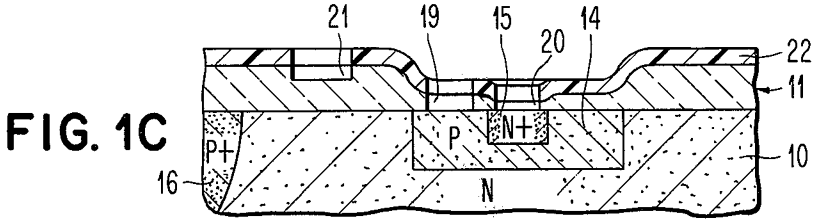

Next, as shown in FIG. 1C, using conventional etchants such as a buffered hydrofluoric acid etch comprising 1 part by volume 40% aqueous hydrofluoric acid to 7 parts ammonium hydrofluoride, the structure is etched for 3 minutes at 29°C. Openings 19 and 20 are etched completely through the thinner portions of silicon dioxide layer 11 while opening 21 is etched partway, in the order of 3,000A into the thicker portions of the silicon dioxide layer.

Figure 1D:
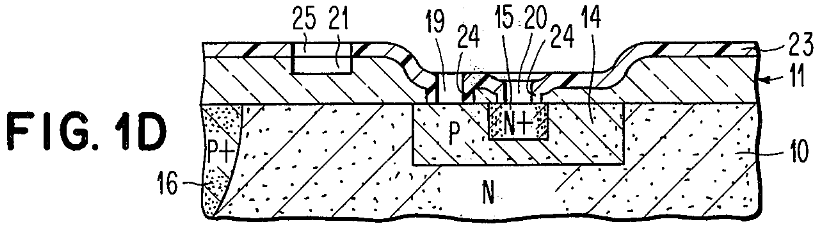
Figure 1D:
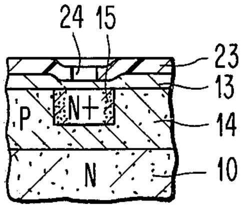

Next, as shown in FIG. 1D, photoresist mask 22 is removed from the structure and a different photoresist mask 23 is formed on the structure. Mask 23 is substantially identical with mask 22 except that openings 24 in the photoresist mask have smaller lateral dimensions than the equivalent openings 17 in the first photoresist mask 22. Because of the smaller lateral dimensions of openings 24, the sides of openings 19 and 20 in insulative layer 11 are coated with photoresist. Openings 25 in the second photoresist layer 23 have the same lateral dimensions as equivalent openings 18 in the first photoresist mask 22.

The structure is then subjected to the abovedescribed etching composition at a temperature of 30°C. for about 2 minutes. This time is sufficient for openings 21 to be completely etched through the thicker portion of the silicon dioxide layer, FIG. 1E. On the other hand, because the sides of previously formed openings 19 and 20 through the thinner portions of the layer are coated with photoresist, these openings are protected by the photoresist layer from any lateral over-etching.

Figure 1E:
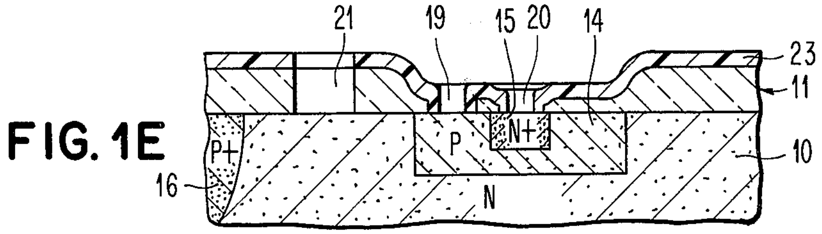
Figure 1E:
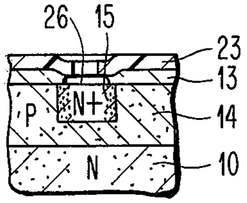

While openings 19 and 20 through the thinner portions of insulative layer 11 are shown to be completely etched through the insulative layer during the first etching step, it is, of course, understood that due to masking defects, etching defects or other reasons, some openings equivalent to openings 19 and 20 in some portions of the insulative layer over the integrated circuits may not be etched or may be partially etched in the initial etching step. Let us consider what happens to one of such openings during the second etching step. With reference to FIG. 1D', photoresist layer 23 has formed therein an opening 24 over a portion of insulative layer 13 which is not etched through. When the structure is then subjected to the second etching step, FIG. 1E', an opening 26 is etched through insulative layer 13. However, since insulative layer 13 is relatively thin, and once it is etched through there is no photoresist to protect the sidewalls against over-etching, over-etching will take place, as shown in FIG. 1E', during the time required for opening 21 to be completely etched through the thicker portion of the silicon dioxide layer. By controlling the time involved in this last etching step, the over-etching of opening 26 can be controlled so that it ends up having the same lateral dimensions as would an opening 20 which was fully etched through during the initial etching step. In this manner, the process can insure reasonably equivalent properties for metallic contacts which may be subsequently deposited in openings, such as opening 20 which was completely opened during the first etching step and opening 26 which was completely opened only during the second etching step.

In the illustrative embodiment, opening 21 has been shown to be partially etched through thicker portion 12 of the silicon dioxide during the initial etching step, it will be understood by one skilled in the art that in appropriate processes, opening 21 may be completely formed in the second etching step while the first etching step is only used to form openings 19 and 20 through portion 13 of the insulative layer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the fabrication of integrated circuits, a method of forming openings through an insultative layer comprising:

forming a layer of electrically insulative material on a substrate, covering said layer with a first photoresist mask having a plurality of openings, forming, by a chemical etching step through said openings in said photoresist mask, a plurality of openings through said insulative layer coincident with said mask openings, removing said first photoresist mask, forming directly on said layer, a second photoresist mask having a plurality of openings coincident with the positions of the openings in said first mask and at least one additional opening not coincident with any of said positions, said openings in said second photoresist mask having smaller lateral dimensions than the openings in said first mask whereby the sides of the openings in the insulative layer are masked by photoresist, and repeating said etching step through said openings in said second mask for a period sufficient to etch an opening through said insulative layer which is coincident with said at least one additional mask opening.

2. The method of claim 1 wherein said substrate is silicon and said insulative layer is silicon dioxide.

3. The method of claim 1 wherein said repeated etching step is carried out for a period of time sufficient to overetch any openings in said insulative layer which failed to be made in the original etching step to lateral dimensions substantially the same as the lateral dimensions of the original openings in the insulative layer.

4. In the fabrication of integrated circuits, a method of forming openings through an insulative layer comprising forming on a substrate a layer of electrically insulative material having thicker and thinner portions, covering said layer with a first photoresist mask having a plurality of openings, applying a chemical etchant through said openings in said photoresist mask for a period of time sufficient to etch a plurality of openings, coincident with openings in said mask, through the thinner portions of said insulative layer and a plurality of partial openings coincident with openings in said mask partially into the thicker portions of said layer, forming directly on said insulative layer, a second photoresist mask having a first plurality of openings coincident with and of at least the same lateral dimension as the openings in the thicker portions of said insulative layer, and a second plurality of openings coincident with and of smaller lateral dimensions than the openings through the thinner portions of said insulative layer, whereby the sides of the openings through the thinner portions of said insulative layer are masked by photoresist, and again applying said chemical etchant to said substrate for a period sufficient to etch said plurality of partial openings through the thicker portions of said insulative layer.

5. The method of claim 4 wherein said substrate is silicon and said insulative layer is silicon dioxide.

* * * * *